US010321580B2

(12) United States Patent
Heller et al.

(10) Patent No.: US 10,321,580 B2
(45) Date of Patent: Jun. 11, 2019

(54) INTEGRATED CIRCUIT PACKAGE ASSEMBLY COMPRISING A STACK OF SLANTED INTEGRATED CIRCUIT PACKAGES

(71) Applicant: International Business Machines Corporation, Armonk, NY (US)

(72) Inventors: Ralph Heller, Wilen b. Wollerau (CH); Patricia Maria Sagmeister, Adliswil (CH); Martin Leo Schmatz, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/223,621

(22) Filed: Jul. 29, 2016

(65) Prior Publication Data
US 2018/0035544 A1    Feb. 1, 2018

(51) Int. Cl.
*H05K 7/20* (2006.01)
*H05K 3/40* (2006.01)
*H05K 3/36* (2006.01)

(52) U.S. Cl.
CPC ............ *H05K 3/4007* (2013.01); *H05K 3/366* (2013.01); *H05K 2201/049* (2013.01); *H05K 2201/10166* (2013.01)

(58) Field of Classification Search
CPC ........ H05K 1/181; H05K 3/301; H05K 1/147; H05K 1/118; H01R 12/79; H01R 12/62; H01R 12/52; H01R 12/78; H01R 12/592; H01R 12/77; H01R 12/71; H01R 12/716; H01R 12/727; H01R 12/73; H01R 12/7029; H01R 12/707

(Continued)

(56) References Cited

U.S. PATENT DOCUMENTS 5,239,447 A * 8/1993 Cotues .................. H01L 24/49
257/686
6,163,070 A * 12/2000 Mori ................... H01L 23/4985
257/686

(Continued)

FOREIGN PATENT DOCUMENTS

CN        203197423 U    9/2013
EP          1842404 B1   9/2014

OTHER PUBLICATIONS

SOS Electronic, "Neither horizontal,nor vertical-slant terminal blocks are the right ones", on-line product brochure, 2 pgs.

*Primary Examiner* — Mandeep S Buttar
(74) *Attorney, Agent, or Firm* — Harrington & Smith (57) ABSTRACT

Embodiments of the present invention are directed to an integrated circuit (IC) package assembly. The IC package assembly includes a base printed circuit board (PCB), and a set of IC packages. Each of the IC packages includes at least one IC chip, mounted on or partly in a support component, which mechanically supports and electrically connects to the IC chip. In addition, each of the IC packages is laterally soldered to the base PCB (e.g., a motherboard PCB) and arranged transversally to the base PCB and forms an angle α therewith. As a result, a slanted stack of IC packages is obtained, wherein the IC packages are essentially parallel to each other. Further embodiments are directed to related devices, including the above assembly, and to related fabrication methods.

24 Claims, 7 Drawing Sheets

(58) Field of Classification Search
USPC ................ 361/784, 679.54; 439/67, 493, 55, 439/620.06; 257/679; 438/108
See application file for complete search history.

(56) References Cited

U.S. PATENT DOCUMENTS

| | | | |
|---|---|---|---|
| 6,420,782 B1* | 7/2002 | Eng | H01L 23/057 |
| | | | 257/686 |
| 7,855,099 B2 | 12/2010 | Ni et al. | |
| 7,980,863 B1 | 7/2011 | Holec et al. | |
| 2002/0064033 A1* | 5/2002 | Deane | G11C 5/04 |
| | | | 361/784 |
| 2005/0141199 A1* | 6/2005 | Chiou | H01L 23/3672 |
| | | | 361/704 |
| 2007/0062727 A1* | 3/2007 | Braman | H05K 3/3405 |
| | | | 174/261 |
| 2009/0122481 A1* | 5/2009 | Chang | H01L 23/3672 |
| | | | 361/679.54 |
| 2009/0135571 A1* | 5/2009 | Chiang | H01R 12/57 |
| | | | 361/784 |
| 2009/0277607 A1* | 11/2009 | Chen | H01L 23/3672 |
| | | | 165/80.3 |
| 2013/0335931 A1* | 12/2013 | Snider | H05K 3/3436 |
| | | | 361/751 |
| 2014/0106578 A1* | 4/2014 | Clayton | H01R 12/78 |
| | | | 439/67 |
| 2016/0313262 A1* | 10/2016 | Smilowitz | G01N 33/227 |

\* cited by examiner

FIG. 7

INTEGRATED CIRCUIT PACKAGE ASSEMBLY COMPRISING A STACK OF SLANTED INTEGRATED CIRCUIT PACKAGES

BACKGROUND

The invention relates in general to integrated circuit packages and compact assemblies thereof (e.g., modules), as well as computer hardware products comprising such assemblies and related fabrication methods. It is, in particular, directed to dense assemblies of integrated circuit packages that comprise integrated circuit chips mounted on printed circuit boards.

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

Printed circuit boards (PCBs) are used to support and electrically connect various electronic components. PCBs use conductive tracks and contact pads, which are typically etched from a copper sheet laminated onto a non-conductive substrate (typically a FR-4 glass epoxy). PCBs can be single sided or double sided. One also knows multi-layer PCBs, which allow for higher component density.

Higher integration and speed of microprocessors and memory requires compact packaging. Of particular importance is the reduction of wire length between devices. High density interconnect boards have been proposed, which comprise blind and/or buried vias and offer higher circuitry density than traditional circuit boards. Beside, rectangular assemblies of PCBs exploit the third dimension, allowing PCBs (or IC packages comprising PCBs) to be placed close to each other. PCBs may for instance be grouped in horizontal or vertical arrangements using sockets to maintain and electrically connect them to, e.g., a base board.

For example, one knows storage systems for shared enterprise storage environments, which are designed to provide scalable performance for various enterprise class applications. Such storage systems may for instance comprise modules that contain storage devices such as NAND Flash devices. These modules are mounted in a structure (e.g., a frame or a metal cage) having specific dimensions, which may be standardized. Such dimensions cannot always easily be changed for any new generation of devices (e.g., chip packages) and modules thereof. In some cases, the dimensions of the device packages and resulting modules cannot be reconciled with the requirements of the legacy structures (e.g., the cages), which obliges manufacturers to develop new formats for the outer structures.

BRIEF SUMMARY

This section is intended to include examples and is not intended to be limiting.

According to a first aspect, an integrated circuit (IC) package assembly is provide. The IC package assembly including: a base printed circuit board (PCB); and a set of IC packages, each comprising an IC chip, mounted on or partly in a support component, which mechanically supports and electrically connects to the IC chip, wherein, each of the IC packages is laterally soldered to said base PCB and arranged transversally to said base PCB, forming an angle α therewith, so as to form a slanted stack of the IC packages, wherein the IC packages are essentially parallel to each other.

According to another aspect, a method of fabrication of an IC package assembly is provided. The method including: providing: a base printed circuit board (PCB); and a set of IC packages, each comprising an IC chip, mounted on or partly in a support component, which mechanically supports and electrically connects to the IC chip, and laterally soldering each of the IC packages to said base PCB, wherein said each of the IC packages is maintained transversally to said base PCB and thereby forms an angle α therewith, so as to form a slanted stack of the IC packages, the latter essentially parallel to each other.

According to another aspect, a computer hardware device is provided. The computer hardware device comprising at least one IC package assembly such as the IC package assembly described above.

IC package assemblies, computer hardware devices or systems and related fabrication methods that embody the present invention will now be described, by way of non-limiting examples, and in reference to the accompanying drawings.

The accompanying drawings show simplified representations of devices or parts thereof, as involved in embodiments. Technical features depicted in the drawings are not necessarily to scale. In particular, only of few IC packages are depicted in the assemblies and distances between the IC packages and thicknesses of the components are exaggerated, on purpose, for the clarity of the depictions. Similar or functionally similar elements in the figures have been allocated the same numeral references, unless otherwise indicated.

DETAILED DESCRIPTION

According to a first aspect, an integrated circuit package assembly, or module, hereafter referred to as an "IC package assembly" is provided. The IC package assembly basically comprises a base printed circuit board, or base PCB, and a set of integrated circuit packages, or IC packages. Each of the IC packages comprises at least one integrated circuit chip, or IC chip, mounted on or partly in a support component, which mechanically supports and electrically connects to the IC chip. In addition, each of the IC packages is laterally soldered to the base PCB (e.g., a motherboard PCB) and arranged transversally to the base PCB and forms an angle $\alpha$ therewith. As a result, a slanted stack of IC packages is obtained, wherein the IC packages are essentially parallel to each other.

As it can be realized, the angle $\alpha$ can be tuned to optimally fit an assembly of slanted IC packages into a structure (e.g., a metal cage). The angle $\alpha$ may, in particular, be adapted to fit IC package assemblies into a legacy structure, whose vertical requirements would otherwise not allow assemblies of perpendicular IC packages to be inserted therein. Since, in addition, the IC packages are laterally soldered to the base PCB, dense arrangements of IC packages can nevertheless be obtained.

In embodiments, said angle is between 24.1° and 78.3°. It is preferably between 51.4° and 76.1° or, even between 59.0° and 67.3°, for reasons that will become apparent later.

Of particular advantage is to provide support components that have tapered or beveled lateral surfaces, maintained in contact with the base PCB to reinforce mechanical stability and increase vertical compactness if the IC packages in the assembly. For instance, the support component of each of the IC packages may be bounded by two opposite main surfaces, including a first main surface and a second main surface, each delimited by lateral edges. Each support component may otherwise be bounded by lateral surfaces, wherein each of the lateral surfaces meets each of the two opposite main surfaces at one of the lateral edges. A lateral surface of the support component that is in mechanical contact with the base PCB may thus advantageously be shaped so as to form a dihedral angle $\beta_1$ with the first main surface and a dihedral angle $\beta_2$ with the second main surface, where $\beta_1=\alpha$ and $\beta_2=\pi-\alpha$.

Preferably, the support component is a daughter printed circuit board, or daughter PCB, onto which the IC chip is mounted flat. Consistently with the embodiment evoked just above, this daughter PCB may be bounded by two opposite main surfaces, each delimited by lateral edges, and by lateral surfaces, each meeting each of the main surfaces at one of the lateral edges. The daughter PCB may otherwise comprise: a row of first solder pads extending along one of said lateral edges, wherein said first solder pads are connected to second solder pads on said base PCB by any suitable electrical interconnects. The above solder pad arrangement allows lateral soldering and, in turn, dense arrangements of IC packages to be obtained.

Each of the first solder pads may for instance extend up to said lateral edge, i.e., be defined directly at a lateral edge. This allows electrical interconnections with the base PCB to be shortened and further save space on the daughter PCBs. In turn, denser arrangements can be obtained. The first solder pads are preferably defined on a main surface of the daughter PCB and extend along this lateral edge. In variants, the first solder pads may be formed on the adjacent lateral surface.

In preferred embodiments, the daughter PCB of one or more of the IC packages of the stack comprises two opposite rows of first solder pads, to double the density of connections to the base PCB. The two rows of solder pads extend along two opposite lateral edges of a same lateral surface of the daughter PCB. The solder pads of each of the two opposite rows are connected to second solder pads on the base PCB by electrical interconnects. Each solder pad is preferably plated with an electrically conductive material.

In embodiments, the IC package assembly further comprises one or more additional electronic components mounted on the base PCB, on a side opposite to a side on which said IC packages are laterally soldered. Such additional components may impose additional requirements, in terms of dimensions. It is thus all the more advantageous to be able to tune the angle $\alpha$ of the IC packages. For instance, the additional electronic components may comprise one or more of a processor (e.g., a CPU or GPU) and a field-programmable gate array components.

In preferred embodiments, the IC chip of one or more of the IC packages is a memory chip, e.g., a Flash memory chip, which may for example include a NAND Flash device. In embodiments, one or more of the IC packages comprise, each, two or more IC chips that are mounted flat on the daughter PCB. The additional IC chip may for example be another Flash device or a DRAM component.

According to another exemplary embodiment, a computer hardware device, such as a storage system, which comprises one or more IC package assemblies such as described above is provided.

In preferred embodiments, this computer hardware device further comprises a heat dissipating structure in thermal communication with each of the IC packages. The heat dissipating structure may possibly be configured to mechanically stabilize the IC package assemblies. For instance, the heat dissipating structure may comprise a heat sink and one or more thermally conducting layers or plates, wherein each of the layers or plates is intercalated between two IC chips of successive IC packages of the stack and in thermal communication with the heat sink. Preferably, each of the one or more thermally conducting layers or plates is mounted on an IC chip of an IC package of the stack.

The hardware device may notably comprise a cage, comprising two opposite cage walls between which said IC package assembly is mounted. A minimal distance between the two opposite cage walls may be less than a dimension of a largest component of any of the IC packages. Said dimension is measured in a plane perpendicular to each of said cage walls. More generally, dimension requirements imposed by the cage walls and, if necessary, other components to be inserted therein (which may form part of the IC package assembly) will be less than the dimension of the largest component of any of the IC packages, whence the advantage of the slanted configuration. In addition, a minimal (clearance) distance between the IC packages of the stack and a proximal cage wall may be required, which may, e.g., be of at least 0.1 mm.

According to another exemplary embodiment, a method of fabrication of an IC package assembly such as described above is provided. This method first comprises providing a base PCB and a set of IC packages. Each IC package comprises an IC chip mounted on or partly in a support component, which mechanically supports and electrically connects to the IC chip. Then, each of the IC packages is laterally soldered to the base PCB, while being maintained transversally to the base PCB to thereby form an angle $\alpha$ therewith. Eventually a slanted stack of the IC packages is obtained, wherein the IC packages are essentially parallel to each other, as described earlier.

Preferably, the method further comprises, prior to providing said set of IC packages, mounting one or more IC chips on or partly in a support component, so as for the latter to mechanically support and electrically connect the former.

In preferred embodiments, the method further comprises, prior to providing said set of IC packages, a step of processing a given lateral surface of the support component of each of the IC packages, to obtain IC packages with a beveled (or tapered) lateral surface, as evoked earlier. This may notably be achieved thanks to a water jetting technique or any other suited cutting technique. The processed lateral surface is then brought in mechanical contact with the base PCB.

In reference to FIGS. 1-6, an exemplary embodiment is first described, which concerns an integrated circuit package assembly 10, or IC package assembly. The IC package assembly comprises a base PCB 8 (e.g., a motherboard PCB) and a set of IC packages 1, 1a, 1b. Each IC package comprises an IC chip 3, which is mounted on a support component 2, 2a, or partly integrated therein.

The support component 2, 2a is a structure that mechanically supports and electrically connects to the IC chip 3, e.g., via any suitable type of conductors 7, 12, 13. The support component 2, 2a may for example comprises a daughter PCB 2 or an overmold 2a, see FIGS. 1A-1C. In the latter case, the IC chip 3 is at least partly overmolded in the overmold 2a. In the former, the IC chip 3 can be mounted flat on the daughter PCB 2 and electrically connected thereto, e.g., via regular solders. This is discussed later in detail.

Figure 2:
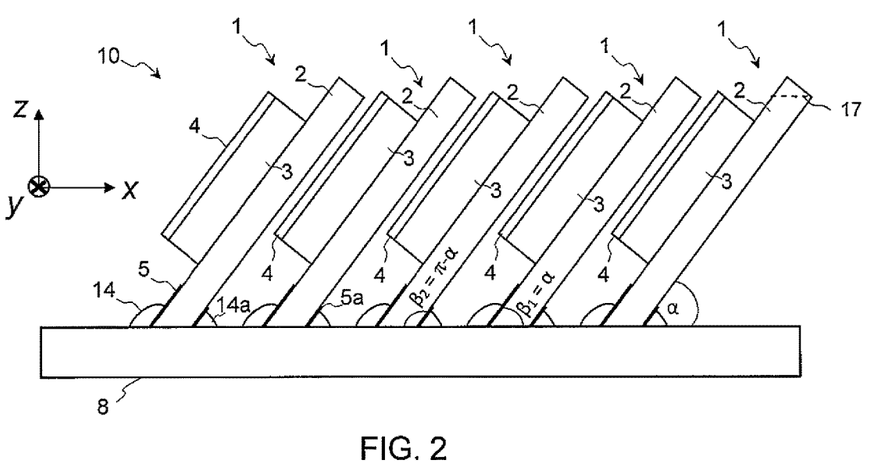
FIG. 2 is a side view of an assembly of IC packages, comprising a slanted stack of IC packages, laterally soldered to a base PCB, according to embodiments.
Figure 3:
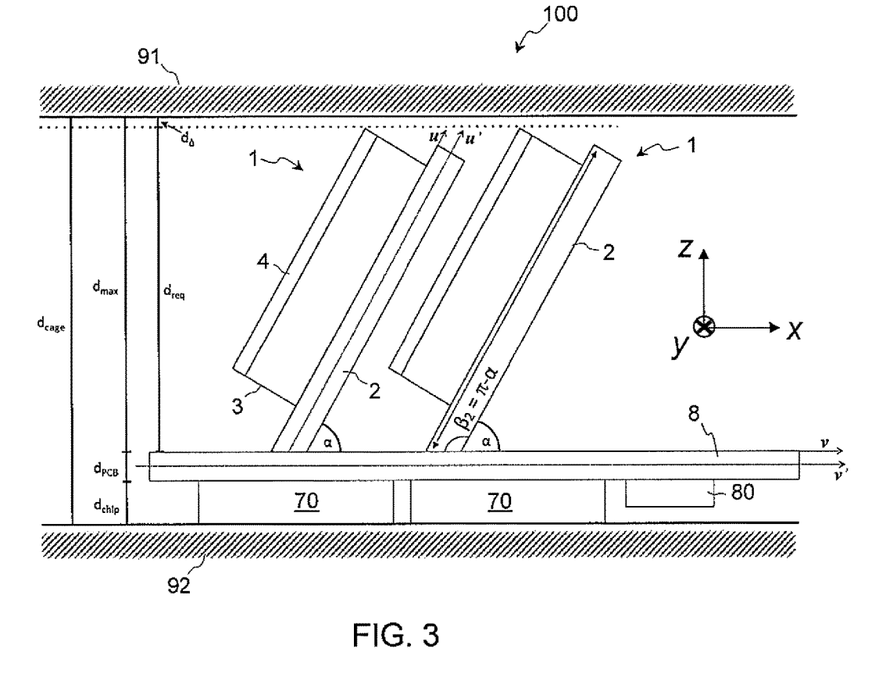
FIG. 3 is a side view of another assembly of IC packages, inserted in a cage of a storage system, and showing various dimension requirements imposed by the cage, as in embodiments.
Figure 4:
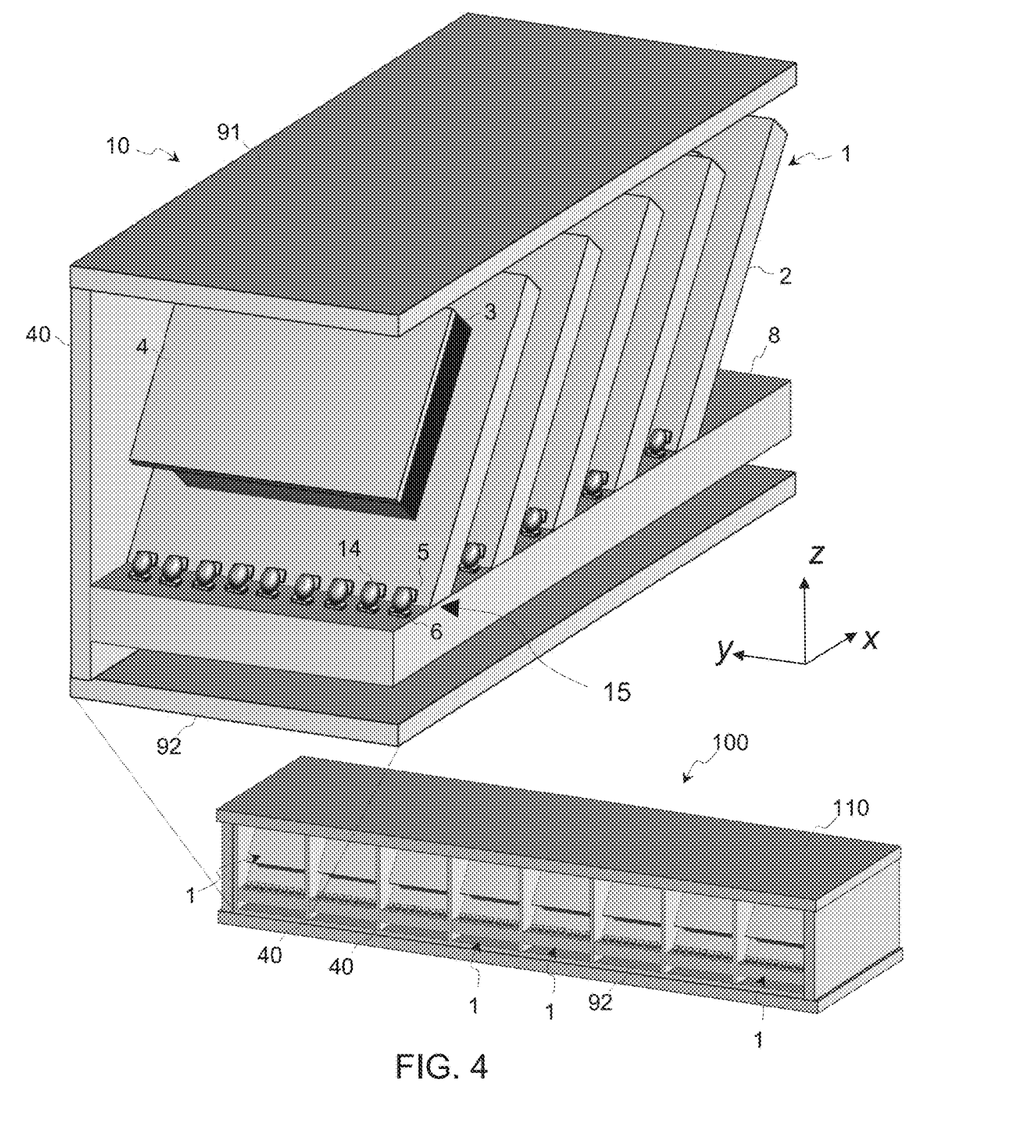
FIG. 4 is a 3D view of a computer hardware device comprising an assembly of IC packages as in FIG. 2 and a heat dissipation structure, according to embodiments.

As seen in FIGS. 2-4, the IC packages are, each, arranged transversally to the base PCB 8, so as to form an angle α therewith, where 0°<α<90°, or, taking into account potential inaccuracies (see below) 1°<α<89°. That is, the average plane of the base PCB 8 extends transversely to the average plane of each of the IC packages 1, 1a, 1b of the stack, but not perpendicularly thereto. Each of the IC packages 1, 1a, 1b is furthermore laterally soldered to the base PCB 8, to electrically connect thereto. Note that, although electrical signals are meant to be conveyed through the various interconnects 7, 13, 14, 14a, these electrical signals may typically encode data/address signals, in addition to conveying power to the chips. Thus, signals to/from an IC chip may flow through a respective support component 2, 2a from/to the base PCB. In addition, the base PCB or any other, additional interconnect may be used to connect IC chips to each other, if necessary. Any suitable type of lateral electrical conductors may be used to achieve lateral soldering and ensure proper connections to the base PCB.

As a result, a slanted stack of IC packages 1, 1a, 1b is obtained, wherein the IC packages are essentially parallel to each other. I.e., these packages are meant to be mounted parallel to each other on the base PCB 8, despite very small differences that may occur in the mounting process. Having parallel IC packages allows the density of IC packages to be increased in the assembly 10, see e.g., FIGS. 2 and 4, it being reminded the drawings are not to scale. In particular, the thicknesses of and distances between adjacent IC packages are exaggerated, on purpose, and for the clarity of the depiction. For the same reasons, only a small number of IC packages is depicted.

Differences between the angles formed between each IC package and the base PCB are preferably less than 1.0° (there are, ideally, no differences at all). The angle α formed between each IC package and the motherboard PCB results in a slanted (i.e., angled) stack, whereby the average plane of each IC package diverges from the vertical lateral sides of the cage walls and the horizontal plane of the base PCB.

The above arrangement allows particularly dense arrangements of IC packages 1, 1a, 1b to be obtained, despite dimensional requirements that may be imposed by the cage or any other outer structure in which the above assembly is to be mounted. Indeed, the slanted configuration of the stack may allow to fit IC packages in a given legacy cage, despite potential requirements in terms of available, vertical distance, whereas a perpendicular arrangement of the same IC packages may not necessarily fit into that same cage, as assumed in FIG. 3. A small density loss occurs because of the slanted arrangement compared with a perpendicular arrangement. This loss, however, is mitigated due to the typically large number of IC packages used in a same assembly (e.g., more than 20, 30, 100 or more, e.g., 104) and by the fact that vertical requirements are effectively reduced.

The present assemblies of IC packages rely on lateral soldering technique, which allows a substantial increase of IC density. For example, solder pads can be formed along a lateral edge LE of the support component (e.g., a PCB 2), directly at the lateral edge LE and/or on a lateral surface LS of the PCB 2. Such solder pads make it possible to electrically connect the PCB 2 from a lower edge or a lower lateral surface to the base PCB 8, to enable data/address signals to flow to/from the PCB 2. A vertical (though slanted) configuration results, which, in turn, allows dense arrangement of IC packages to be obtained.

The lateral soldering circumvents the need for sockets to connect the PCBs 2 to the base PCB 8. As it can be realized, the dimensions of such sockets inherently limit the density that can be achieved by piling up packages 1. Instead, using lateral soldering as proposed herein allows IC packages to be brought closer to each other and thereby denser IC package assemblies can be obtained. Such sockets may nevertheless be used, in embodiments, to maintain and connect the base PCB 8 in the modules 10. If necessary, mechanical reinforcement can be contemplated to improve the mechanical stability of the IC assemblies. However, mechanical reinforcement may be provided by a suitably shaped heat dissipation structure. In particular, slanted comb structures may be used which involve intercalated plates or foils (e.g., made of copper), for heat dissipation purposes.

These concepts will notably find applications for memory packages and assemblies. In particular, the present concepts can be used with any memory or storage component, e.g., DRAM, Flash, etc. The high-density arrangements disclosed herein may notably be used in 3D memory bar arrangements. More generally, any IC chip may be contemplated to produce IC package assemblies according to embodiments.

The IC packages 1, 1a, 1b may be connected to each other via the base PCB 8, as mentioned above. In addition, or in variants, an IC chip 3 of a first IC package 1 may be electrically connected to an IC chip 3 of a second IC package 1 of the stack, thanks to additional interconnects, i.e., independently from said base PCB 8. In that respect, we note that the IC packages are not necessarily soldered to a single base PCB 8. Rather, two or more (up to four) base PCBs may be involved, e.g., below, on top of and/or on the sides of the stack. The IC packages 1, 1a, 1b may thus be laterally connected to one or more of these base PCBs. Moreover, one or more chips, e.g., memory chips, can be mounted on a respective support component 2, 2a, to form an IC package, in embodiments.

As depicted in FIGS. 1-5, the IC chips 3 are preferably provided on that side of the support component 2, 2a that forms an obtuse angle with the base PCB 8, i.e., "on top" of the PCB 8. Indeed, and as it may be realized, this allows more freedom to optimize the angle α, else the thickness of the IC chip would, if placed on the other side, impose additional restriction as to the angle, owing to its proximity with the base PCB 8. Eventually, providing IC chips 3 "on top" allows the density of the assembly to be improved.

If necessary, additional mechanical structures may be involved, to help maintain the slanted IC packages 1, 1a, 1b in the assembly. For example, a cooling structure may be present, which may advantageously be configured to help maintaining the slanted IC packages, as discussed later in reference to FIG. 4.

In practice, the angle α chosen depends on the dimensional constraints imposed by, e.g., the cage and/or other components. Preferred ranges for this angle may be determined according to the usual legacy cage dimensions and dimensions of newest chips and support components 2, 2a, as discussed later in detail. In general, this angle will be between 25.1° and 77.3°, subject to an accuracy of about ±1.0°, due to potential (small) differences between the various IC packages and inaccuracies in the actual measure of the angle with respect to the base PCB. Preferably, this angle is between 52.4° and 75.1° (±1.0°). In particular embodiments, it is between 60.0° and 66.3° (±1.0°), for example of about 64° (±1.0°). This angle is typically measured between the support component (which typically is the largest component of the IC package, e.g., a daughter PCB) and the base PCB 8.

To ease the assembly 10, the support component 2, 2a of each of the IC packages 1, 1a, 1b may be shaped consistently with the above angle α. Namely, the support components 2, 2a of FIG. 1A-C may be slightly modified to have a tapered or beveled cross-section, at least on one lateral surface thereof. Assume, for instance, that a support component 2 is bounded by two opposite main surfaces MS and by lateral surfaces LS, as in FIGS. 6A and 6B. These two opposite main surfaces MS are delimited by lateral edges LE and each of the lateral surfaces LS meets each of the opposite main surfaces MS at one of the lateral edges LE.

While the form factor of the support components 2, 2a of FIGS. 1A-1C and 6A and 6B generally compare to a parallelepiped, the same types of components 2, 2a may be processed to have a beveled lateral surface LS. This is illustrated in FIGS. 2-5, where the lower lateral surfaces LS of the support component (e.g., a PCB 2) that comes in mechanical contact with the base PCB 8 is now slanted, see in particular FIG. 5. A suitable planar contact is achieved if the lower lateral surface forms: (i) a dihedral angle $\beta_1$ with the upper main surface; and (ii) a dihedral angle $\beta_2$ with the lower main surface of the PCB 2, where the dihedral angles fulfil the conditions $\beta_1=\alpha$ and $\beta_2=\pi-\alpha$. Of course, the latter equalities may be subject to tolerances owing to dispersions and inaccuracies in the process used to shape the lower lateral surface of the support component 2, which are typically less than 1% in practice. Note that the same numeral reference 2 is adopted for the daughter PCB 2 throughout FIGS. 1-6, be it laterally processed or not.

The angle $\beta_1=\alpha$ can be regarded as a dihedral angle, i.e., as the acute angle between two intersecting planes. For example, and as illustrated in FIG. 3, this angle may be taken between u and v, i.e., between an outer surface of the support component 2 and an outer surface of the base PCB. This angle may equivalently be measured as the angle between u' and v', i.e., between the average planes of the support component 2 and the base PCB, since such objects are essentially planar objects. In each of these examples, angle $\beta_1=\alpha$ can be viewed as an angle between two intersecting planes. Same considerations apply to the complementary angle $\beta_2=\pi-\alpha$.

As further illustrated in FIG. 3, the cross-section of the support component 2, 2a may accordingly form a convex quadrilateral, with a tapered edge, e.g., forming a simple bevel on the side touching the base PCB 8. It may for instance essentially form a right trapezoid or right-angled trapezoid, with two adjacent right angles on the free side, as in FIGS. 2-5. As the beveled edge surfaces of the IC packages touch the motherboard PCB, mechanical stability and compactness can both be improved. In variants, the upper side of the IC packages may be beveled too (as represented, e.g., by the dotted line 17 in FIG. 2), to better fit IC packages into a cage or laterally connect to an upper base PCB, if needed.

In the embodiments of FIGS. 1A-B, 2, 4, 6A and 6B, the support components are assumed to be daughter PCBs 2, onto which the IC chips 3 can be mounted flat. For example, a main surface of an IC chip 3 may face and electrically connect one of the two main surfaces MS of a daughter PCB 2, e.g., via usual solder pads and solder balls or solder paste. As evoked above, the daughter PCBs 2 are preferably laterally beveled, as depicted FIGS. 2-5. In variants, overmolds 2a may be used, as in FIG. 1C, instead of PCBs, which overmolds may also be suitably processed to exhibit a tapered lateral surface, brought in mechanical contact with the base PCB 8. Of course, care should be taken, in each case, to avoid mechanical (and hence electrical) contacts between outer conductors 7, 12 of the component 2, 2a and conductors (e.g., signal lines) of the base PCB 8.

Figure 6:
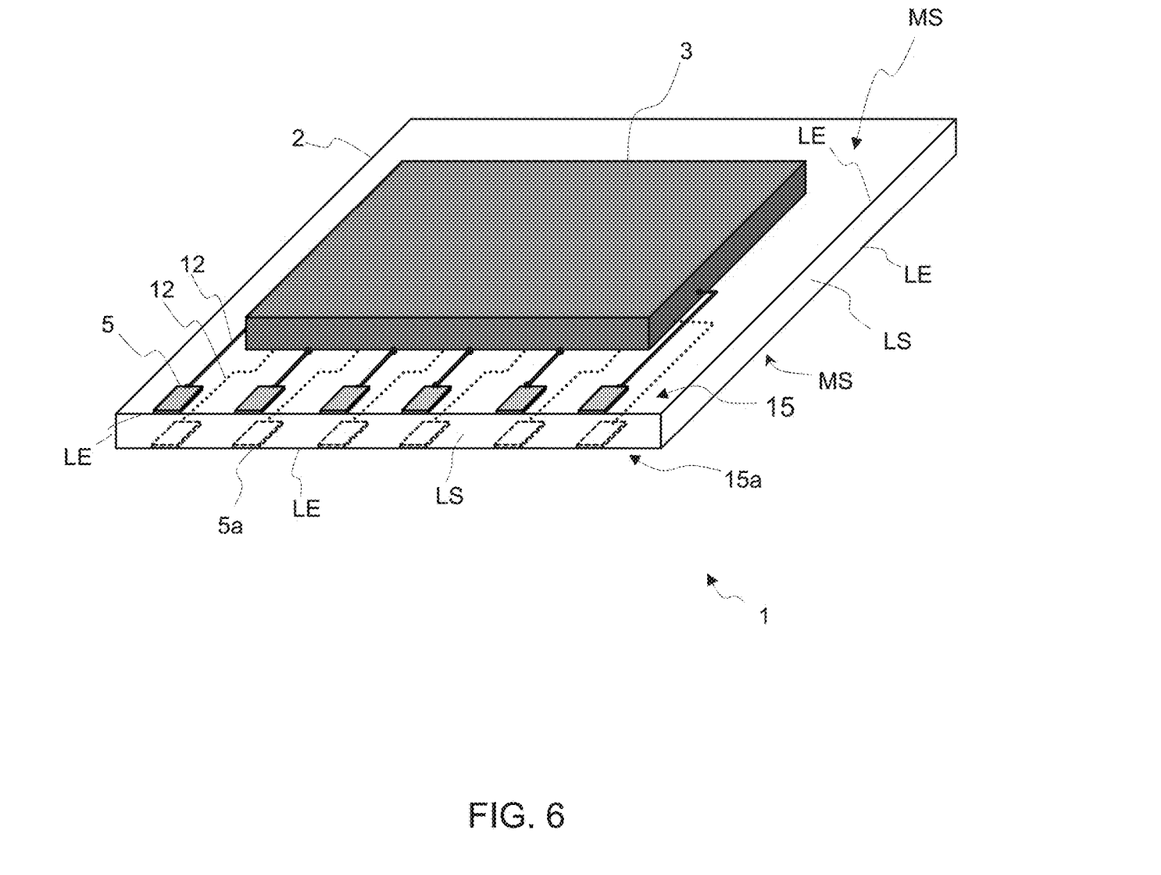
FIG. 6A is a 3D view of an example single IC package as in FIG. 1A
FIG. 6B is a 3D view of another example single IC package as in FIG. 1A, as involved in embodiments.
Figure 6A:
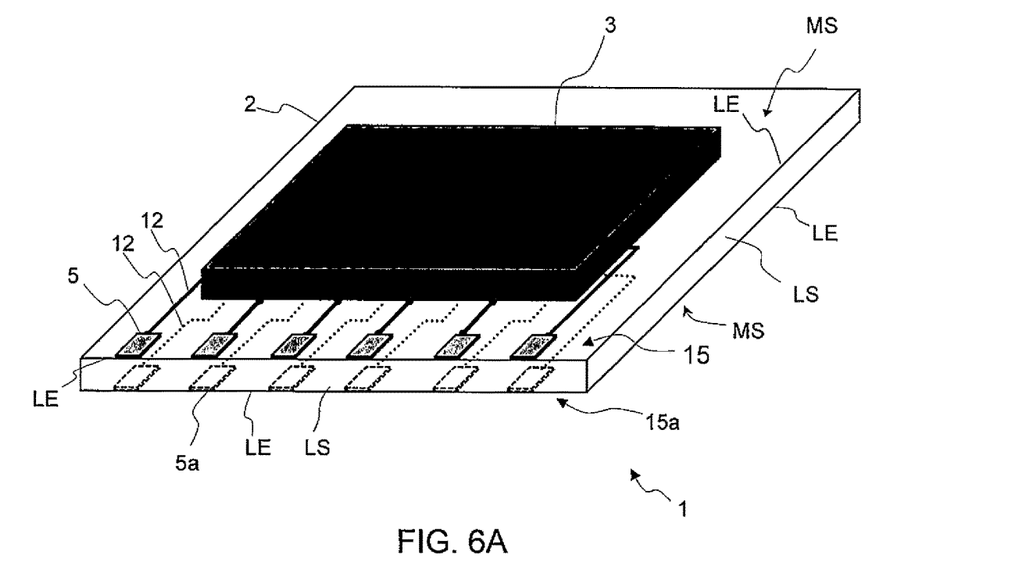
Figure 6B:
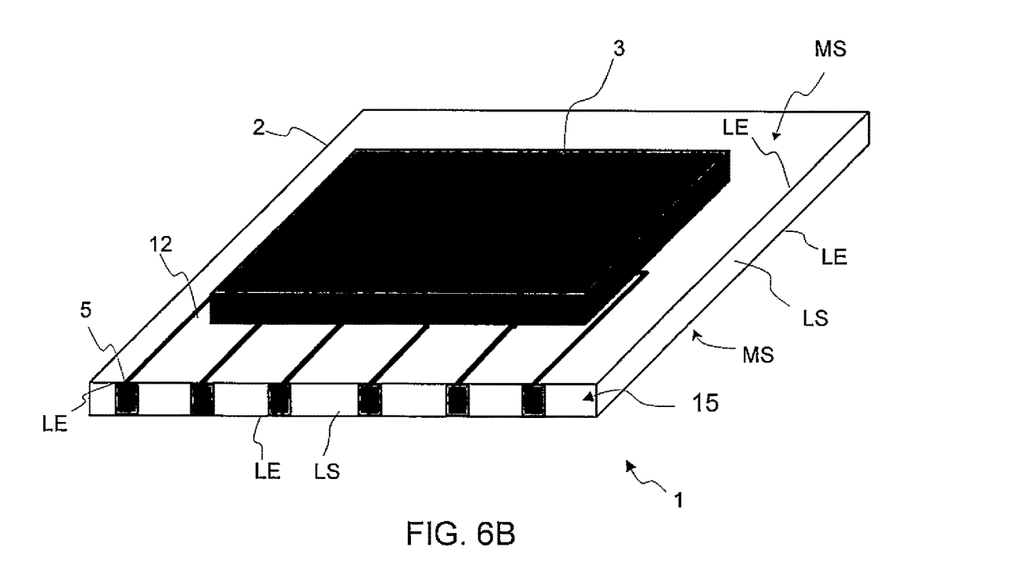

As best seen in FIG. 4 or 6A, the daughter PCBs 2 may exhibit, each, a row 15 of solder pads 5 extending along one of their lateral edges LE, wherein the solder pads 5 are connected to companion pads 6 on the base PCB 8 by electrical interconnects 14. In variants to solder pads, any suitable electrical conductors may be used. The electrical interconnects 14 used to connect the daughter PCBs 2 to the base PCB 8 may be formed, for example, by solder paste or by solder balls In other variants, the solder pads of the PCB 2 may be formed on the lower lateral surfaces LS of the daughter PCBs as shown in FIG. 6B for example.

Figure 1A:
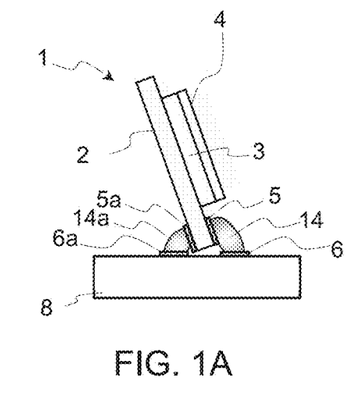
FIGS. 1A-1C are side views of different types of IC packages, laterally soldered to a base PCB and forming an angle therewith, as involved in embodiments.
Figure 1B:
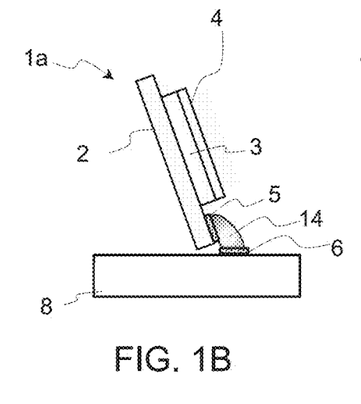

As seen in FIGS. 1a, 2 and 6A, the daughter PCB 2 of one or more of the IC packages 1 preferably comprises two opposite rows 15, 15a of solder pads 5, 5a. Said rows extend along two opposite lateral edges LE of a same lateral surface LS (e.g., the lower surface) of the daughter PCB. As before, these solder pads 5, 5a are connected to companion second solder pads 6, 6a on the base PCB 8 by electrical interconnects 14, 14a. Preferably, each solder pad 5, 5a is formed directly at a lateral edge LE, i.e., it extends up to a lateral edge LE, to optimize the surface on the PCBs 2 to house the IC chips and ease lateral connections to the base PCBs. Each solder pad is typically plated with an electrically conductive material, e.g., they are preferably copper-plated, to favor electrical conduction.

Figure 1C:
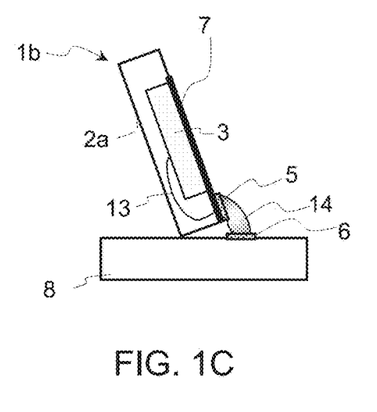

If, instead of daughter PCBs 2, overmolds 2a are used (as in FIG. 1C), then suitable electrical conductors may be formed on the lower lateral surface of the overmold 2a as bus lines or as through mold vias (TMVs) extending transversely to an average plane of the overmolds 2a, which TMVs can later be exposed laterally. As mentioned earlier, IC chips can be mounted so as to be partly overmolded in the overmold 2a, as depicted in FIG. 1C. Appropriate connections can be established through outer conductors 7 or inner wires 13.

In reference to FIG. 3, the IC package assembly 10 may, in embodiments, further comprise one or more additional electronic components 70, 80 mounted on the base PCB 8, on the (lower) side opposite to the (upper) side on which IC packages 1 are laterally soldered. For example, the additional components may comprise processors 80 and/or field-programmable gate array (FPGA) components 70. Processors may include any kind of processing elements, such as microprocessors, e.g., a central or graphics processing units.

The IC chips 3 of any of the IC packages 1, 1a, 1b may notably include memory chips, such as Flash memory chips. Preferably, use is made of flash memory chips of the NAND type, i.e., relying on NAND (negative-AND) logic gates. In addition, or in variants, DRAM devices may be involved. In other variants, NOR Flash devices or still other memory devices (e.g., PCM, MRAM, RRAM, or any compatible memory device) may be soldered on the daughter PCBs. In that respect, and as noted earlier, one or more of the IC packages 1 may comprise, each, two or more IC chips 3, e.g., each mounted flat on the daughter PCB 2.

According to another embodiment, computer hardware device 100 is provided. Such a device 100 is depicted in FIG. 4: it comprises several IC package assemblies 10, such as described earlier. A given one of these assemblies 10 is magnified in the upper part FIG. 4 (inset), wherein the support components 2 are daughter PCBs, as assumed in the following.

In embodiments, the device 100 further comprises a heat dissipating structure 40, 4, 91, 92, in thermal communication with the IC packages 1, so as to evacuate heat therefrom. The heat dissipating structure may notably comprise a heat sink 40 and thermally conducting layers 4, which may be foils or plates, e.g., essentially made of copper. Yet, such layers 4 are optional inasmuch as the material used for the support component 2, 2a may already be a sufficiently good thermal conductor, especially where overmolds 2a are used, FIG. 1C.

In the following, thermally conducting layers 4 are assumed to be cooper foils, without prejudice. Such foils 4 may be intercalated between IC chips 3 of adjacent IC packages 1 of each module 10. They are otherwise in thermal communication with the heat sink 40, to dissipate heat evacuated from the IC chips therein. Preferably, the foils 4 are mounted on respective IC packages 1 of the stacks, as assumed in FIGS. 2-5. In that respect, the IC packages may further be in mechanical contact, whereby a foil 4 mounted on one chip 3 of a given package 1 may touch the daughter PCB 2 of a neighboring package. This way, each foil 4 contributes to evacuate heat from both the chip it is mounted on and the adjacent daughter PCB 2 it touches.

As evoked earlier, the hardware device 100 may typically comprises an outer structure 110 (e.g., a frame, a canister or a cage). In the following, this outer structure 110 is assumed to be a metal cage, as in FIG. 4. Thus, the cage 110 can itself be regarded as forming part of the heat dissipation structure. The cage 110 may notably include opposite walls 91, 92, between which the IC package assemblies 10 are arranged. As just mentioned, the walls 91, 92 may form part of the heat dissipation structure. The cage 110 may for instance be a legacy cage, dimensioned so that it would not be possible to fit a module comprising a base PCB 8 (and possibly other components 70, 80) and the IC package stack therein if the IC packages 1 were perpendicularly mounted on the base PCB 8. Yet, a slanted arrangement 10 makes this possible and the angle α may further be chosen so as to optimize the density of the stacks in the cage.

The minimal distance between the two opposite cage walls 91, 92 may for instance be less than a dimension of the largest component (typically the daughter PCB 2) of one or more of the IC packages 1. This dimension is measured in a plane perpendicular to each of the cage walls 91, 92, along direction z in FIG. 3. More generally though, the various distance requirements imposed by the cage and/or components 1, 8, 70, 80 of the assembly 10 may not be compatible with the dimension of the IC packages (in a perpendicular arrangement).

In addition, and as shown in FIG. 3, one may want to preserve a minimal (clearance) distance $d_A$ between the IC packages 1 and a proximal one 91 of the cage walls, to avoid short circuits or mechanical contacts (e.g., between a copper foil 4 of a IC packages 1 and the upper cage wall 91) and hence potential damages upon assembling the components, if necessary. This distance $d_A$ may typically be between 0.1 and 0.2 mm. In variants, one may, on the contrary, want the copper foils 4 to touch the upper wall 91 and hence favor heat dissipation. Damages can nevertheless be prevented by mounting upper walls of the cage 110 in a last stage. As evoked earlier, the upper lateral surface of a support component 2, 2a may even be beveled, to level off mechanical contacts on top.

Figure 5:
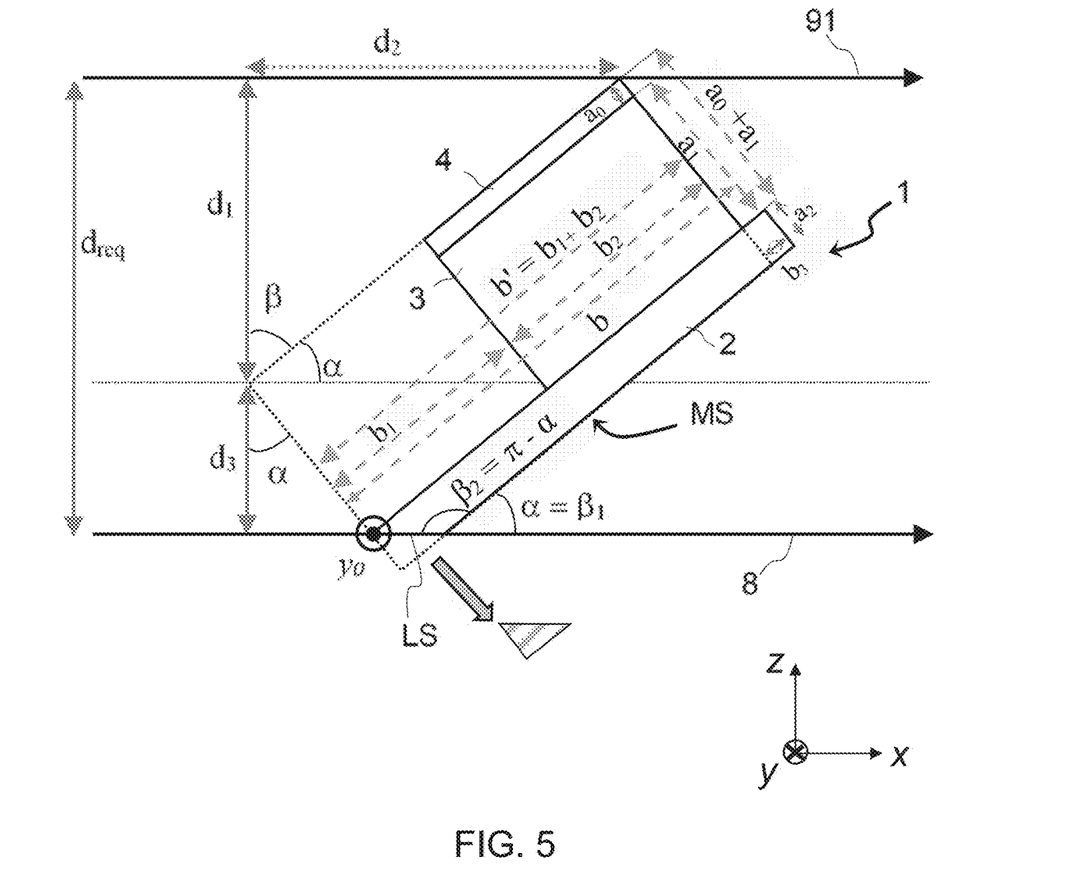
FIG. 5 is a cross-section view of an IC package, laterally touching a base PCB and forming an angle α therewith. The figure illustrates how the optimal angle α can be estimated.

As it can be realized from FIGS. 3 and 5, for a given available space $d_{reg}$, the maximal angle α affordable is determined by the maximal dimensions $b=b_1+b_2+b_3$ and $b'=b_1+b_2$ of the IC package 1 and by the thicknesses $a_0$, $a_1$ of the components 3, 4, as well as their relative offsets on the support structure 2. Other parameters may impact the determination of this angle, such as the clearance distance $d_A$ (assumed to be zero in FIG. 5) between the free end of the package 1 and the proximal cage wall 91. The available space $d_{reg}$ depends on the space $d_{cage}$ available between the cage walls 91, 92, FIG. 3, which space is reduced by the thicknesses $d_{PCB}$, $d_{chip}$ of the base PCB 8 and components 70, 80 below the PCB 8 (and possibly by the upper clearance $d_A$, if not zero), see FIG. 3.

Yet, each IC package 1 can be rotated until its "effective" height fits into $d_{reg}$. Depending on the rotation axis chosen, a lateral ablation of the support structure 2 may be needed. In FIG. 5, the IC package 1 is assumed to be rotatable with respect to axis $\gamma_0$, which implies trimming off that part of the PCB 2 that collides with the PCB 8 upon rotation. Ablating this part results in a lateral, beveled surface LS that can touch the base PCB 8, as discussed earlier. The part removed by ablation is depicted with a pattern of slanted lines in FIG. 5.

As it can be realized, the maximal angle α is determined by two conditions, which need be jointly fulfilled:
  First, the IC package must be rotated enough so that the upper end of the daughter PCB 2 does not touch the upper wall 91; and
  Second, the IC package must be rotated enough so that the upper end of the foil 4, on top of the chip 3 does not touch the upper wall 91 either. The second condition is necessarily fulfilled if, contrary to the assumption of FIGS. 3 and 5, the chip 3 and foil 4 are placed below the main surface MS of the daughter PCB 2.

Using the notations of FIG. 5, the first condition is satisfied if the sum of the vertical distances $d_1+d_3$ is less than $d_{reg}$, which leads to $d_1+d_3 \leq d_{reg}$. Since $d_1=(b_1+b_2)\cdot\sin(\alpha)$ and $d_3=(a_0+a_1)\cdot\cos(\alpha)$, this leads to the condition $(b_1+b_2)\sin(\alpha)+(a_0+a_1)\cos(\alpha) \leq d_{reg}$, from which values of α can be determined (analytically or numerically).

In order to determine the second condition, assume that the IC package can be further rotated counter-clockwise about the axis $\gamma_0$ (irrespective of whether the IC chip actually allows this or not), until the upper corner of the daughter PCB 2 touches the upper wall 91. There, one realizes that the second condition is satisfied if $\sin(\alpha) \leq d_{reg}/b$, where $b=b_1+b_2+b_3$. The thickness $a_2$ of the daughter PCB (e.g., 2.4 mm)

does not directly impact the maximal value allowed for α, though it impacts the density of the IC packages in the assembly.

The range of possible dimensions for $a_1$, $b_2$ and b are determined by the standard sizes of available chips and PCBs. The keepout distance requirements $b_1$, $b_3$ may typically be of at least 0.5 mm; they depend on the package used and additional components (e.g., capacitors, resistors, etc.) that may be placed around the chip. But as it is also possible to embed such decoupling elements into the daughter PCB itself, such that smaller keepout values may be used. For instance, $b_3$ may thus be smaller than 0.5 mm, e.g., 0.25 mm, or even be zero. In addition, the keepout area requirements need not be symmetric. Fixing the upper keepout distance $b_3$ determines the lower keepout distance $b_1 = b - b_2 - b_3$. The same considerations otherwise apply to the lower keepout distance $b_1$, which may typically be larger than 0.5 mm as well. Configurations where $b_3 < b_1$ are preferred, so that the IC chips are slightly shifted upward, which leaves more room for the lower interconnects 5, 5a, 14, 14a. This, however, further constrains the maximal angle allowed and thus slightly impacts the resulting density.

The solder pads 5, 5a may typically be fit into a 0.01 mm² square, so that a keepout distance of 0.25 mm would already be sufficient. The thickness $a_0$ of the heat dissipation foil need typically be adapted. It may depend on the heat dissipation of the IC chip, the arrangement of the chip and the direction of the heat spreading. Possible values for $a_0$ vary between 0 mm (no foil is present, provided the material of the support component 2, 2a is sufficiently thermally conducting) and 1.1 mm (e.g., for a TLC Flash chip), they are for example of 0.4 or 0.7 mm. Yet, higher values, e.g., 2.2 mm may be contemplated too, at the cost of deteriorating the density. The thickness $a_1$ of the chip (e.g., a flash memory chip) depends on the type of package used and typically vary between 0.9 mm and 1.4 mm. The total height (or width) b of the daughter PCB 2 depends on the keepout requirements ($b_1$, $b_3$) and the chip dimensions $b_2$. It typically varies between 13 mm and 15.1 mm. The total height (or width) $b_2$ of the chip typically varies between 12 mm and 14.1 mm. The maximal height $d_{max}$ available in the cage is for example of 20 mm or 23 mm; it is typically defined by proprietary, legacy systems and may thus not be easily changed from one generation of IC packages to the next. But, further taking into account the thicknesses of components 70, 80 (e.g., 3.5 mm for FPGAs and 2.4-2.6 mm for the base PCB 8) and additional, horizontal copper foils, if any, the available space $d_{reg}$ may, in particularly preferred embodiments, be of 13.09, 13.89, 13.99, 14.09, or 14.59 mm. A horizontal copper foil (not shown) may be provided to dissipate heat from the components 8, 70, 80. More generally, the available space $d_{reg}$ may typically vary between 8 mm and 15 mm (see Table I below).

TABLE I

| | Thicknesses | | Heights (widths) | | | | Maximal value of α (deg) allowed | Maximal value of α (deg) allowed | Maximal value of |
| --- | --- | --- | --- | --- | --- | --- | --- | --- | --- |
| $d_{req}$ | $a_0$ | $a_1$ | $b_1$ | $b_2$ | $b_3$ | b | by IC chip | by daughter PCB | α (deg) |
| 8 | 0.4 | 0.9 | 0.5 | 14.1 | 0.5 | 15.1 | 28.0 | 32.0 | 28.0 |
| 8 | 1.1 | 0.9 | 0.5 | 14.1 | 0.5 | 15.1 | 25.1 | 32.0 | 25.1 |
| 10 | 0.4 | 0.9 | 0.5 | 12 | 0.5 | 13 | 46.8 | 50.3 | 46.8 |
| 10 | 0.4 | 0.9 | 2.6 | 12 | 0.5 | 15.1 | 37.9 | 41.5 | 37.9 |
| 10 | 0.4 | 0.9 | 0.5 | 14.1 | 0.5 | 15.1 | 37.9 | 41.5 | 37.9 |
| 10 | 0.4 | 1.4 | 0.5 | 12 | 0.5 | 13 | 44.2 | 50.3 | 44.2 |
| 10 | 0.4 | 1.4 | 2.6 | 12 | 0.5 | 15.1 | 35.8 | 41.5 | 35.8 |
| 10 | 0.4 | 1.4 | 0.5 | 14.1 | 0.5 | 15.1 | 35.8 | 41.5 | 35.8 |
| 10 | 1.1 | 0.9 | 0.5 | 12 | 0.5 | 13 | 43.1 | 50.3 | 43.1 |
| 12 | 0.4 | 0.9 | 0.5 | 12 | 0.5 | 13 | 66.8 | 67.4 | 66.8 |
| 12 | 0.4 | 0.9 | 2.6 | 12 | 0.5 | 15.1 | 49.9 | 52.6 | 49.9 |
| 12 | 0.4 | 0.9 | 0.5 | 14.1 | 0.5 | 15.1 | 49.9 | 52.6 | 49.9 |
| 12 | 0.4 | 1.4 | 0.5 | 14.1 | 0.5 | 15.1 | 47.6 | 52.6 | 47.6 |
| 12 | 1.1 | 1.4 | 2.6 | 12 | 0.5 | 15.1 | 44.4 | 52.6 | 44.4 |
| 12 | 1.1 | 1.4 | 0.5 | 14.1 | 0.5 | 15.1 | 44.4 | 52.6 | 44.4 |
| 13.09 | 0.4 | 0.9 | 2.6 | 12 | 0.5 | 15.1 | 58.2 | 60.1 | 58.2 |
| 13.09 | 0.4 | 0.9 | 0.5 | 14.1 | 0.5 | 15.1 | 58.2 | 60.1 | 58.2 |
| 13.09 | 0.4 | 1.4 | 2.6 | 12 | 0.5 | 15.1 | 55.8 | 60.1 | 55.8 |
| 13.09 | 0.4 | 1.4 | 0.5 | 14.1 | 0.5 | 15.1 | 55.8 | 60.1 | 55.8 |
| 13.09 | 1.1 | 0.9 | 0.5 | 14.1 | 0.5 | 15.1 | 54.9 | 60.1 | 54.9 |
| 13.09 | 1.1 | 1.4 | 2.6 | 12 | 0.5 | 15.1 | 52.4 | 60.1 | 52.4 |
| 13.89 | 0.4 | 0.9 | 2.6 | 12 | 0.5 | 15.1 | 66.3 | 66.9 | 66.3 |
| 13.89 | 0.4 | 0.9 | 0.5 | 14.1 | 0.5 | 15.1 | 66.3 | 66.9 | 66.3 |
| 13.89 | 0.4 | 1.4 | 0.5 | 14.1 | 0.5 | 15.1 | 63.7 | 66.9 | 63.7 |
| 13.89 | 1.1 | 0.9 | 0.5 | 14.1 | 0.5 | 15.1 | 62.7 | 66.9 | 62.7 |
| 13.89 | 1.1 | 1.4 | 0.5 | 14.1 | 0.5 | 15.1 | 60.0 | 66.9 | 60.0 |
| 13.99 | 0.4 | 0.9 | 2.6 | 12 | 0.5 | 15.1 | 67.6 | 67.9 | 67.6 |
| 13.99 | 0.4 | 0.9 | 0.5 | 14.1 | 0.5 | 15.1 | 67.6 | 67.9 | 67.6 |
| 13.99 | 0.4 | 1.4 | 0.5 | 14.1 | 0.5 | 15.1 | 65.0 | 67.9 | 65.0 |
| 13.99 | 1.1 | 0.9 | 0.5 | 14.1 | 0.5 | 15.1 | 63.9 | 67.9 | 63.9 |
| 13.99 | 1.1 | 1.4 | 0.5 | 14.1 | 0.5 | 15.1 | 61.1 | 67.9 | 61.1 |
| 14.09 | 0.4 | 0.9 | 2.6 | 12 | 0.5 | 15.1 | 68.9 | 68.9 | 68.9 |
| 14.09 | 0.4 | 0.9 | 0.5 | 14.1 | 0.5 | 15.1 | 68.9 | 68.9 | 68.9 |
| 14.09 | 0.4 | 1.4 | 0.5 | 14.1 | 0.5 | 15.1 | 66.3 | 68.9 | 66.3 |
| 14.09 | 1.1 | 0.9 | 0.5 | 14.1 | 0.5 | 15.1 | 65.2 | 68.9 | 65.2 |
| 14.09 | 1.1 | 1.4 | 0.5 | 14.1 | 0.5 | 15.1 | 62.3 | 68.9 | 62.3 |
| 14.59 | 0.4 | 0.9 | 2.6 | 12 | 0.5 | 15.1 | 79.4 | 75.1 | 75.1 |
| 14.59 | 0.4 | 0.9 | 0.5 | 14.1 | 0.5 | 15.1 | 79.4 | 75.1 | 75.1 |
| 14.59 | 0.4 | 1.4 | 0.5 | 14.1 | 0.5 | 15.1 | 75.6 | 75.1 | 75.1 |
| 14.59 | 1.1 | 0.9 | 0.5 | 14.1 | 0.5 | 15.1 | 74.1 | 75.1 | 74.1 |
| 14.59 | 1.1 | 1.4 | 0.5 | 14.1 | 0.5 | 15.1 | 70.3 | 75.1 | 70.3 |

TABLE I-continued

| | Thicknesses | | Heights (widths) | | | | Maximal value of α (deg) allowed by IC chip | Maximal value of α (deg) allowed by daughter PCB | Maximal value of |
| --- | --- | --- | --- | --- | --- | --- | --- | --- | --- |
| $d_{req}$ | $a_0$ | $a_1$ | $b_1$ | $b_2$ | $b_3$ | $b$ | | | α (deg) |
| 14.73 | 1.1 | 0.9 | 2.6 | 12 | 0.5 | 15.1 | 80.5 | 77.3 | 77.3 |
| 14.73 | 1.1 | 0.9 | 0.5 | 14.1 | 0.5 | 15.1 | 80.5 | 77.3 | 77.3 |
| 14.73 | 1.1 | 1.4 | 0.5 | 14.1 | 0.5 | 15.1 | 74.2 | 77.3 | 74.2 |

Of course, the above values are only examples and may change depending on the IC packages 1 and the legacy structures 110 considered. A large number of potential configurations were tested by the Inventors, for which the optimal angle α was calculated. Such configurations have been explored using a systematic approach (taking account of most common dimensions for the chips, the daughter PCBs and legacy structures as generally available on the market), wherein forbidden or irrelevant configurations were rejected. The full results are not reported here, for conciseness. However, a sample of configurations is given in Table I below, for which the optimal angle α is calculated, based, on the one hand, on the maximal value of a allowed by IC chip (first condition above) and, on the other hand, on the maximal value of a allowed by the daughter PCB 2 (second condition). In a few occurrences, the second condition is the limiting factor.

As seen in Table I, the optimal angle α typically spans a range of values between 25.1° and 77.3°. Thus, in preferred embodiments, the angle α formed between any of the IC packages 1 of an assembly 10 is between 24.1° and 78.3°, taking into account possible measurement inaccuracies (±1.0°) and dispersion between the various IC packages 1 across assemblies 10. Of particular interest are the specific requirement distances $d_{reg}$ between 13.09 and 14.59 mm, for which the optimal angle α spans a narrower range of values between 52.4° and 75.1°. Thus, in preferred embodiments, the angle α is between 51.4° and 76.1°, taking again potential inaccuracies into account. Other, more specific configurations have been considered ($d_{reg}$=13.89 mm), leading to a more particularly preferred range of [60.0°; 66.3°] ±1.0°.

Figure 7:
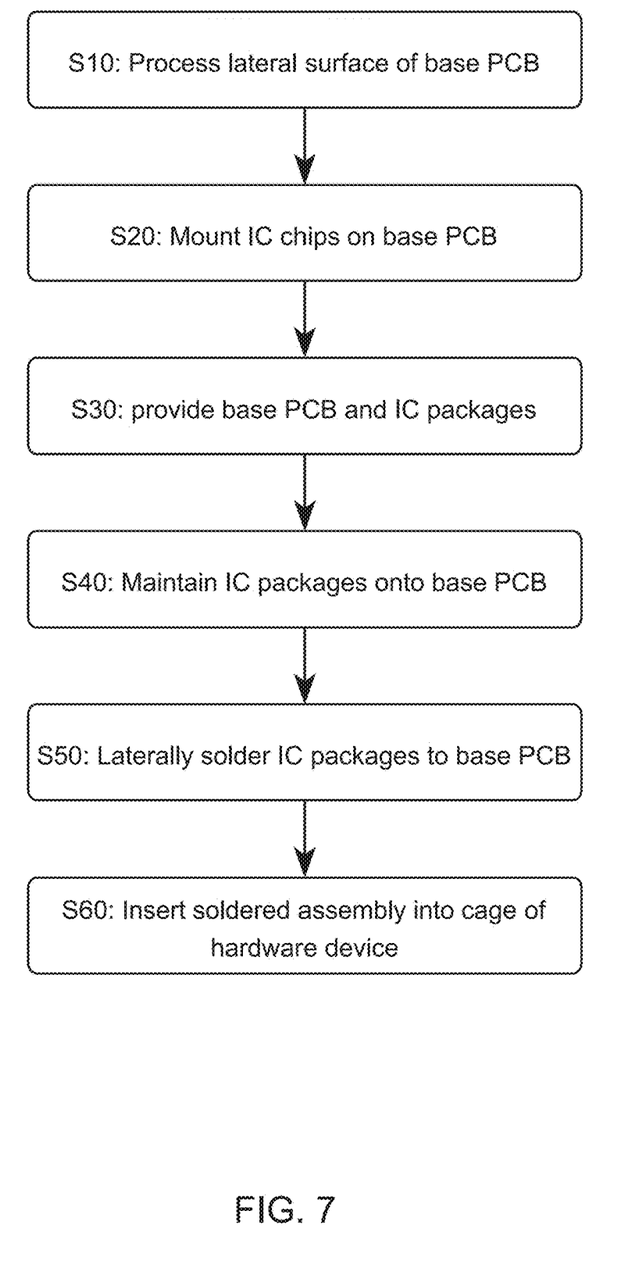
FIG. 7 is a flowchart of high-level fabrication steps of a device according to embodiments.

Another exemplary embodiment is now described in reference to FIG. 7, which concerns a method of fabrication of an IC package assembly such as described above. Basically, the method relies on a base PCB and a set of IC packages, steps S10-S30. Each IC package comprises an IC chip, mounted on or partly in a support component, as discussed earlier. Each of the IC packages is laterally soldered S50 to the base PCB, while being maintained S40 transversally to the base PCB, so as to form an angle α with the base PCB. A slanted stack of IC packages is accordingly formed, wherein the packages are essentially parallel to each other, consistently with principles discussed earlier. If necessary, additional mechanical structures are used, when laterally soldering the IC packages. Such additional structures may be left in place after soldering, if needed. Yet, other structures already present such as the heat dissipation structures may be sufficient to mechanically hold the IC packages, so that no additional mechanical structures may be needed, in embodiments.

After soldering, the assemblies 10 may be inserted S60 into the cage of a computer hardware device such as described earlier in reference to FIG. 4. In variants, the soldered assemblies may be placed within an open cage, which is closed afterwards. That is, the upper wall 91 in FIG. 4 may be fixed after placing the assembly formed by the IC packages 1 and the PCB 8 (plus possibly other components 70, 80) in a structure formed by parts 40 and 92.

The IC chips 3 need to be mounted and soldered before the support components 2, 2a are soldered onto the base board 8. Thus, in embodiments, the present methods further comprising, prior to providing said set of IC packages, a step of mounting S20 the IC chips on or partly in respective support components 2, 2a, so as for the latter to mechanically support and electrically connect the former. Components 70, 80 on the base board 8 can be soldered together with the soldering of the support components 2, 2a onto the base board 8.

In order to avoid melting the solder joints on the daughter PCBs 2 when soldering the daughter boards 2 to the base board 8, two options can notably be contemplated. A first option is to use dual-temperature soldering. In such a case, the solders for the daughter boards 2 have a higher melting temperature than the solder used to connect the daughter boards 2 with the base PCB 8. A second option is to use a vapor-phase soldering method. Several vapor-phase soldering methods are known, which avoid heating the entire daughter PCBs 2

Mechanical fixtures may be used during the soldering process, to maintain the boards 2 that are being soldered. The fixation angles of the fixtures should preferably allow for transverse movement while they fix the location of the daughter PCBs 2 in other directions. Depending on the weight of the daughter PCBs 2, one may prefer to use a spring that presses the daughter PCBs against the base board 8. Suitable fixation shapes may for instance be obtained using a 3D printer or die casting.

Once the daughter PCBs 2 are soldered, they may need be additionally fixated to avoid deflections, unless additional structures already in place already take care of that. Indeed, one may leverage larger components such as cooling plates to support the daughter PCBs mechanically. For example, slanted teeth of a heat dissipating comb structure may be used to provide mechanical stability. Else, one may use traditional fixation methods, such as angles, bolts, or rivets. In addition, epoxy resin can be injected.

Also, the present methods preferably comprise, prior to providing the set of IC packages: processing S10 a given lateral surface of the support components of each of the IC packages, so as to obtain a beveled lateral surface, as explained earlier in reference to FIGS. 2-4. If necessary, the opposite lateral surface might be processed too. Thus, when laterally soldering the IC packages to the base PCB, the IC packages may be maintained transversally to the base PCB, with the processed lateral surfaces in mechanical contact therewith. The processing S10 of the lateral surfaces may be performed using a water-jetting technique. In variants, other techniques (e.g., mechanical cutting, laser cutting) may be used to obtain a clean slanted cut. Yet, water-jetting techniques gave the best results so far.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. An integrated circuit (IC) package assembly, comprising:
    a base printed circuit board (PCB); and
    a set of IC packages, each comprising a support component and an IC chip, the IC chip mounted on or partly in the support component, where the support component mechanically supports and electrically connects to the IC chip, wherein:
    the base PCB and each of the support components are rigid, and
    the support component of each of the IC packages is laterally soldered to said base PCB such that a first beveled surface of each of the support components contacts the base PCB and is arranged transversally to said base PCB to form an angle $\alpha$ therewith, so as to form a slanted stack of the IC packages that are essentially parallel to each other, and wherein each of the support components comprise a second beveled surface opposite the first beveled surface.

2. The IC package assembly according to claim 1, wherein said angle is between 24.1° and 78.3°.

3. The IC package assembly according to claim 1, wherein said angle is between 51.4° and 76.1°.

4. The IC package assembly according to claim 1, wherein the support component of each of the IC packages is bounded by:
    two opposite main surfaces, including a first main surface and a second main surface, each delimited by lateral edges; and
    lateral surfaces, each of the lateral surfaces meeting each of the two opposite main surfaces at one of the lateral edges,
    and wherein,
    a given one of the lateral surfaces is the first beveled surface and is in mechanical contact with said base PCB and forms a dihedral angle $\beta_1$ with the first main surface and a dihedral angle $\beta_2$ with the second main surface, where $\beta_1 = \alpha$ and $\beta_2 = \pi - \alpha$.

5. The IC package assembly according to claim 1, wherein said support component is a daughter PCB, onto which the IC chip is mounted flat, said daughter PCB being bounded by:
    two opposite main surfaces, each delimited by lateral edges; and
    lateral surfaces, each meeting each of the main surfaces at one of the lateral edges,
    wherein one of the lateral surfaces is the first beveled surface,
    and wherein the daughter PCB comprises:
    a row of first solder pads extending along one of said lateral edges, wherein said first solder pads are connected to second solder pads on said base PCB by electrical interconnects.

6. The IC package assembly according to claim 5, wherein at least one of:
    each of the first solder pads extends up to said lateral edge; and
    each of the solder pads is formed on one of the lateral surfaces.

7. The IC package assembly according to claim 5, wherein said daughter PCB comprises two opposite rows of first solder pads, the rows extending along two opposite lateral edges of the first beveled surface of said daughter PCB, wherein solder pads of each of the two opposite rows of first solder pads are connected to second solder pads on said base PCB by electrical interconnects.

8. The IC package assembly according to claim 1, wherein the IC package assembly further comprises one or more additional electronic components mounted on the base PCB, on a side opposite to a side on which said IC packages are laterally soldered.

9. The IC package assembly according to claim 8, wherein said one or more additional electronic components comprise one or more of: a processor; and a field-programmable gate array components.

10. The IC package assembly of claim 5, wherein each solder pad of said first and second solder pads is plated with an electrically conductive material.

11. The IC package assembly of claim 1, wherein the IC chip of one or more of the IC packages is a memory chip.

12. The IC package assembly of claim 11, wherein said memory chip is a Flash memory chip.

13. The IC package assembly of claim 5, wherein one or more of the IC packages comprise, each, two or more IC chips that are mounted flat on the daughter PCB.

14. A computer hardware device, comprising at least one IC package assembly according to claim 1.

15. The computer hardware device according to claim 14, wherein
    the computer hardware device further comprises a heat dissipating structure, in thermal communication with each of the IC packages.

16. The computer hardware device according to claim 15, wherein
    the heat dissipating structure comprises:
    a heat sink; and
    one or more thermally conducting layers or plates, wherein each of the layers or plates is intercalated between two IC chips of successive IC packages of the stack and in thermal communication with the heat sink.

17. The computer hardware device according to claim 14, wherein
    each of the one or more thermally conducting layers or plates is mounted on an IC chip of an IC package of the stack.

18. The computer hardware device according to claim 14, wherein
the hardware device further comprises a cage, the later including two opposite cage walls between which said IC package assembly is arranged.

19. The computer hardware device according to claim 18, wherein
a minimal distance between said two opposite cage walls is less than a dimension of a largest component of any of the IC packages, said dimension measured in a plane perpendicular to each of said cage walls.

20. The computer hardware device according to claim 18, wherein
a minimal distance between the IC packages of the stack and a proximal one of the cage walls is at least of 0.1 mm.

21. A method of fabrication of an IC package assembly according to claim 1, the method comprising:
providing:
a base printed circuit board (PCB); and
a set of IC packages, each comprising a support component and an IC chip, the IC chip mounted on or partly in the support component, where the support component mechanically supports and electrically connects to the IC chip, and where each of the support component and the base PCB are rigid; and
laterally soldering the support component of each of the IC packages to said base PCB such that a first beveled surface of each of the support components contacts the base PCB, wherein each of the IC packages is maintained transversally to said base PCB and thereby forms an angle α therewith, so as to form a slanted stack of the IC packages that are essentially parallel to each other, and wherein each of the support components comprise a second beveled surface opposite the first beveled surface.

22. The method of fabrication according to claim 21, wherein
the method further comprises, prior to providing said set of IC packages: mounting one or more IC chips on or partly in at least one of the support components, so as for the latter to mechanically support and electrically connect the former.

23. The method of fabrication according to claim 21, wherein
the method further comprises, prior to providing said set of IC packages: processing a given lateral surface of the support component of each of the IC packages to form the first beveled surface, so as for said support component to comprise two main surfaces, including a first main surface and a second main surface, each met by lateral surfaces that include said given lateral surface, the latter forming a dihedral angle $\beta_1$ with the first main surface and a dihedral angle $\beta_2$ with the second main surface, wherein $\beta_1$ is essentially equal to a and $\beta_2$ is essentially equal to $\pi-\alpha$,
and wherein,
the method further comprises, while laterally soldering each of the IC packages to said base PCB, maintaining said each of the IC packages transversally to said base PCB, so as to form said angle α therewith, with a respective, processed lateral surface in mechanical contact with said base PCB.

24. The method of fabrication according to claim 23, wherein
processing said given lateral surface is performed using a water-jetting technique.

\* \* \* \* \*